May 24, 1938. J. J. DALEY Re. 20,735
MEANS AND PROCESS FOR THE AMPLIFICATION OF RADIANT ENERGY
Original Filed Oct. 24, 1927
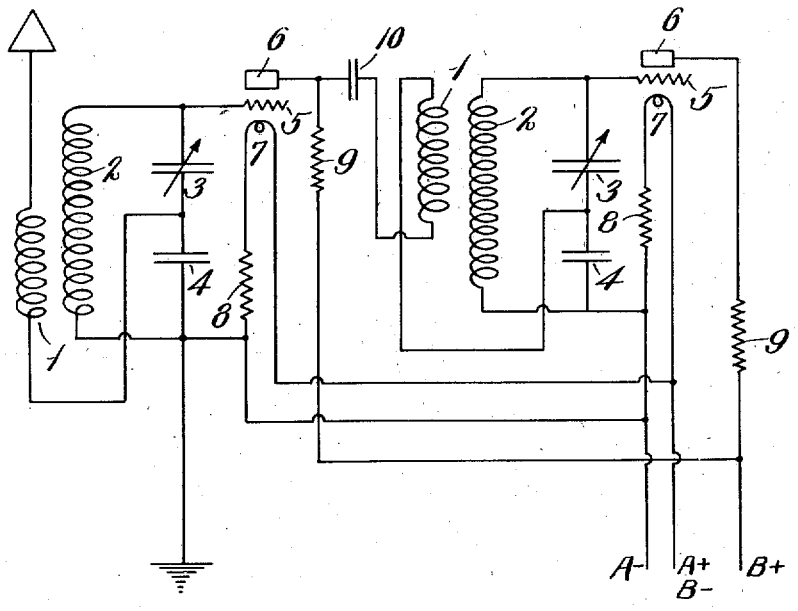
Inventor:
Joseph J. Daley
By George A. Rockwell,
Atty.

Reissued May 24, 1938

Re. 20,735

UNITED STATES PATENT OFFICE 20,735

MEANS AND PROCESS FOR THE AMPLIFICATION OF RADIANT ENERGY

Joseph J. Daley, Boston, Mass., assignor, by mesne assignments, to Research Products Corporation, Boston, Mass., a corporation of Massachusetts Original No. 1,764,934, dated June 17, 1930, Serial No. 447,715, a division of original application dated October 24, 1927, Serial No. 228,249. Application for reissue June 13, 1932, Serial No. 617,064

15 Claims. (Cl. 179—171)

This invention relates to a novel method of amplification of radiant energy and the avoidance of such currents as produce undesired oscillation in the amplifier circuit. Heretofore, the oscillations produced by these currents were largely the limiting factor in radio frequency amplification, and it was found necessary to suppress them by resorting to external means to produce other currents in opposition, or to introduce high resistance into the circuit. Either method was undesirable since the introduction of resistance materially reduced the efficiency of the circuit, making it less sensitive and less selective; while the method depending upon the production of an opposing current not only reduced the overall efficiency of the amplifier, but was in itself effective only over a very limited range of frequency.

Heretofore all systems of reception and amplification of radiant energy were built around the conception that these disturbing currents and their consequent oscillations were inevitable. Certain systems sought to force these oscillations further to produce a form of amplification in connection with the detector tube but this gave rise to very serious distortion and undesirable noises. When true amplification at high frequencies was attempted these oscillations, as stated above, became the limiting factor and had to be damped and suppressed before any appreciable degree of amplification could be obtained. It has been found that when these undesired oscillatory currents have been suppressed to a degree that permits of reasonable amplification, the desired and useful oscillatory currents in the circuit have also been suppressed to a very considerable degree, thus reducing the efficiency of the entire circuit.

I have found that apart from the condition of self-sustained and/or forced oscillations and the condition of neutralized and/or damped oscillations there exists a third condition where there is no flow of currents which will produce undesired oscillations and therefore no regeneration. In my invention I have brought about this condition of true non-regeneration, never before realized, by a novel arrangement and selection of values of inductances and capacities 1, 2, M between 1 and 2, 9, 3, 10 and 4 which in themselves constitute the amplifier circuit. This condition of true non-regeneration is obtained by selection of values which will produce a zero difference of potential in respect to all regenerative currents in any phase between the elements, such as grid and plate, of the electronic device at any desired frequency. The electrical relation of the various parts of the circuit is such that this condition of true non-regeneration is automatically maintained for any desired frequency; and since no regenerative currents in any phase can now exist, all necessity for their suppression by any means external to the necessary circuit elements has been eliminated. This novel arrangement of inductances and capacities more specifically described below produces a higher degree of amplification per stage than has been obtainable by any other system and eliminates entirely the distortions and noises set up when regenerative currents in any phase are present.

I have also found that distortion and unstable operation in an amplifier may be present even when the undesired oscillatory currents are not present. This condition is brought about by the flow of currents, desirable in themselves, in a path where they do not belong. In other words, to obtain a high degree of efficiency in amplification without distortion, the circuit must contain only the useful and desirable currents and their flow must be restricted to their proper and useful paths. The means by which I accomplish this object are described in detail below.

Thus this invention makes possible optimum amplification at any desired frequency and equal amplification at all frequencies without disturbing currents.

Since the energy transfer due to electromagnetic coupling increases with an increase of frequency, and since the magnetic coupling remains constant at its optimum value, the point is quickly reached at which the tube and circuit will go into violent oscillation, thereby distorting all reception and/or amplification. In my invention, however, the energy transfer takes place not only by means of electromagnetic coupling, but also by means of electrostatic coupling simultaneously. The value of energy transfer through static coupling is a function of frequency, and if the value of the static coupling were constant, the combination of magnetic and static coupling must still vary with frequency in approximately a straight line ratio. Since the energy transfer through the static coupling varies coincidentally with changes in received frequency but in the inverse ratio, the combination of magnetic and static coupling and the associated inductances and capacities could be made to produce, by a proper selection of values, the maximum transfer of energy without permitting at any time the existence of disturbing currents which produce undesired oscillations in the tube.

In this invention, the direct means used to create static coupling is a capacity connecting the primary and secondary windings of the radio frequency transformer. This capacity, however, is also in series with the variable condenser, and therefore the real value of the effective tuning electrostatic leg of this system must be represented by the values of the two capacities in series, which would be mathematically speaking the value of one over the sum of their reciprocals. In other words, $$C^t = \frac{1}{\frac{1}{C^1} + \frac{1}{C^2}}$$

In this electrostatic leg, the variable condenser is to the coupling condenser in or about the ratio of 1 to 20. Therefore, as the system is tuned to a higher frequency, the value of the variable condenser is reduced, thereby reducing the entire value of the static coefficient of coupling which, combined with other factors, compensates for the increase in value of magnetic coupling due to increased frequency. Conversely, as frequency decreases, the increase in value of the variable condenser increases the static coefficient of coupling and thereby, combined with other factors, compensates for the decreased value of the magnetic coefficient of coupling for the lower frequency.

The determination of the values of the two capacities must be made mathematically by following the formula $$C^t = \frac{1}{\frac{1}{C^1} + \frac{1}{C^2}}$$

where $C^1$ is the variable condenser, and $C^2$ is a capacity of fixed value. For any desired band of frequencies, the value of $C^1$ must be such as to produce the proper tuning with its associated inductance and capacity.

When the proper values have been obtained, the act of tuning will automatically maintain the proper balance between the electromagnetic and electrostatic legs, thus maintaining the maximum energy transfer at all frequencies, and other elements properly considered preventing the production of such currents as would produce undesired oscillations.

In addition, all other undesired currents are excluded from the circuits, and all undesired transfers of energy from one part of the circuit to another are prevented by means of choke coils and condensers, etc. as shown hereinafter.

The inductances used in the magnetic leg of this amplifier circuit take the form of transformers. I have found as a result of a long series of experiments that the introduction of a direct current into the primary of such a transformer is extremely detrimental. The radio currents impressed upon the primary of such a transformer are necessarily of a very low intensity and are modulated for example by voice frequencies, music or other modulating frequencies. It is desired that the current induced in the secondary winding of the transformer retain without any change the modulation characteristics of the original current although there may have been a certain definite increase in voltage. If any direct current is allowed to flow in the primary coil, the magnetic field intensity is inevitably increased. This field intensity may increase until distortion of the incoming signal is produced by reason of external materials in the field. Its effect is to change or suppress the fine variations of the modulated current, in fact it may entirely eliminate some of the weaker modulations. As a result of this, the current induced in the secondary of a transformer in which direct current is allowed to flow in the primary, does not contain a true reproduction of the modulations existing in the radio current originally impressed on the primary.

Since these modulations represent and are produced by the original voice, music, etc., and on them, after rectification, depends the reproduction of that voice or music, it is obvious that if they are changed or suppressed or eliminated to any degree in transit, the resulting reproduction must be untrue and distorted. To meet this condition, I have introduced into the plate circuit and preferably before the primary a capacity so arranged in one of its functions as to prevent all direct potential from appearing at the primary of the transformers, but at the same time permitting free flow of the modulated pulsating radio frequency current into said primaries.

It must be noted that the interposition of such a capacity will result in a change of phase in the current flowing in the primary of the transformer. It must be noted that the direction of winding and the poling of the winding terminals of the primary coil with reference to the direction of the secondary winding is a factor in maintaining the phase relationship of the component voltages constituting the resultant grid voltage and the winding direction of the primary is preferably reversed with respect to the secondary and the poling so chosen as to maintain the desired characteristics with frequency.

When direct current is allowed to flow in the primary of the transformers the resulting intensification of the magnetic flux also greatly enlarges the external field of the coil. Thus it becomes increasingly difficult to prevent undesired energy transfer through inter-stage coupling. If shielding is used the shields for each stage must be made so large as to be unpracticable, otherwise the entire efficiency of the amplifier is greatly reduced as a result of the large eddy currents set up. By eliminating all direct current from the transformers, as I have done in my invention, the external field is so reduced that small close shields may be used and all inter-stage coupling removed. In fact the external field is so small that in many instances shielding may be dispensed with.

I have also found that the voltage drop across the high impedance of the common source of plate current supply created by the passage of the pulsating current flowing back from the plate may effect a coupling between stages or a feed back to the grid circuit. I have placed choke coils of such values and in such a position with respect to the power source and the plate circuit of each stage so as to substantially eliminate this very detrimental effect.

The drawing forming part of this specification illustrates in diagram the circuits embodying my invention. The drawing shows two stages of radio frequency amplification although the invention is not restricted to that number. Starting with the antenna circuit, each stage consists preferably of an air core radio frequency transformer having a minimum of dielectric, of which 1 is the primary and 2 is the secondary. This transformer is tuned by two condensers or other capacities, one of which, 3, is variable, and 4 is fixed; the condenser 4 being in series connection electrically with the condenser 3, and both being in shunt connection across the terminals of the secondary coil 2, thus making the combination of capacities 3 and 4 variable when 3 is varied. The circuit also contains an electronic tube having grid 5, plate 6 and filament 7.

The filament 7 is connected to its battery in the usual manner, and has in its circuit a suitable resistance 8, preferably in the negative side, to maintain the proper operating condition. The grid 5 is connected to one end of the secondary coil 2; the other end of the secondary constituting the grid return being connected into the negative side of the filament circuit at a point between the resistance 8 and the battery.

The plate 6 is connected to its battery through a radio frequency choke coil 9, and to the primary 1 of the next following radio frequency transformer through a condenser 10.

In this way, while the direct potential of the plate battery may pass readily to the plate 6 through the choke 9, it can never appear at the primary 1 of the radio frequency transformer because of the interposition of the condenser 10 and the tuning condensers. On the other hand, the electromagnetic component on the plate being of a modulated pulsating nature will flow readily into the primary coil 1 through the condenser 10 where it is desired, but is effectively checked to an appreciable degree by inherent impedance from flowing further into the plate battery circuit or through it into adjacent stages of amplification, where it is not desired, by the interposition of the choke 9. The primary coil 1 has its one end connected to the plate of the preceding tube through the condenser 10, or to the antenna in the case of the first stage, and its other end connected to the common connector between the rotor plates of the variable condenser 3 and one side of the fixed condenser 4.

Thus the variations in the electromagnetic side (the coils 1, 2) due to change of frequency combined with other factors are compensated for in the electrostatic side which is made up of the condensers 3 and 4, since there exists between the primary 1 and the secondary 2 not only magnetic coupling but also static coupling through the condenser 4 which is itself in series with the condenser 3, the effective values of the series combination of 3 and 4 being variable. The values and relationships of all inductances and capacities comprising the entire amplifier circuit are such that their variation with changes of frequency and by the operation of tuning produces a condition of substantial equality between the total inductive reactance and the total capacitive reactance at every frequency to which the system may be tuned.

It has been pointed out previously in this specification that the desired condition of true non-regeneration is brought about by the selection of values of inductances and capacities and their relationship which in themselves constitute the amplifier circuit. Thus it is clear that the results obtained with my circuit are obtained by the co-related effect of the sum of the values of all circuit elements and their relationships so as to produce zero difference of potential with respect to all regenerative currents in any phase. Therefore it is obvious that numerous combinations of such values and relationships, resulting in zero difference of potential with respect to all regenerative currents in any phase, can be obtained for different bands of frequencies and when distinct characteristics with frequency are required. It is impracticable to set forth in this specification all the possible combinations of values to maintain zero difference of potential with respect to regenerative currents in any phase for all frequency bands. Therefore, I have set forth a plane of reference, namely, "zero difference of potential with respect to all regenerative currents in any phase," as common to all combinations of values and relationships and as expressing the measure of the requirements of my system at any frequency. A usual method of selecting the tentative effective values of inductances and capacities, both self and mutual, as described by me in my specifications and drawing, applicable to the present day broadcast band of 550–1500 kilocycles, would be as follows,—first consider the selective circuit which is shown in my drawing as inductance 2 shunted by capacities 3 and 4. The variable condenser 3 may be of a standard type adapted to tune the broadcast band. It must be noted that the actual tuning capacity as associated with inductance 2 is composed of condensers 3 and 4 in series and one skilled in the art would know that the net tuning capacity would be one over the sum of the reciprocals of the two capacity values which would result in a maximum tuning capacity somewhat less than the actual value of the variable condenser. I have stated in my specifications that the ratio of the value between condenser 4 and condenser 3 is approximately 20–1. According to recognized trade practice this ratio will be understood to refer to the maximum value of the variable condensers. Having determined the net tuning value of condensers 3 and 4 the inductance 2 must be chosen of such a value as to tune the required band of frequencies. With these facts one skilled in the art can readily determine the value of these three impedances. Turn now to the primary inductance 1 and the mutual between 1 and 2. These values would be selected by a designer in accordance to his desires as to sensitivity and selectivity following the well known principles covering these requirements. Ordinarily it has been found that for satisfactory sensitivity and selectivity in the broadcast band the inductance of the secondary 2 will be at least ten times as large as the inductance of primary 1. Having selected a value for the inductance 1 and determined the adjustment of its coupling with inductance 2, there are measurement methods or formulas to determine the values of the mutual inductance between 1 and 2. The reactance values of these impedances can easily be obtained by applying well known formulas. Condenser 10 must be capable of withstanding the dynamic peak potential at the plate and have a high value of leakage resistance and is chosen of such capacity that the resultant algebraic sum of the reactance of the inductive elements 1, 2 and the mutual therebetween and the capacitive elements 3, 4 and 10 is zero, and since these elements constitute all the reactance elements within the output circuit, that circuit becomes non-reactive, having a total impedance consisting merely of its residual resistance and therefore there can be no generation of currents in either phase across the elements of its associated electronic device. The coupling between coil 1 and coil 2 adjusted with condenser 4 and condenser 10 in conjunction with other circuit values is such as to simultaneously maintain the desired characteristics with frequency and non-regeneration. The direction of winding of coil 1 with reference to coil 2 is reversed and the poling chosen so that the resultant voltage appearing at the grid of the next tube is composed of voltages in such phase as to obtain the desired characteristics.

What I claim is:

1. A system of amplification of radiant energy with no production of regenerative currents to either aid or oppose the desired amplification and without external circuit elements to divert or dissipate useful signal energy for the suppression or control of regeneration, wherein only the useful and desired currents are permitted and are restricted to their proper and useful paths; comprising input means for an electronic device and one or more stages of amplification, each stage comprising in combination an electronic device, self and mutual inductive impedance elements including a transformer, and self and mutual capacitive impedance elements, wherein the plate of each preceding electronic device is connected to the primary of the following transformer through a connection consisting of a self capacitive impedance element; and wherein the condition of complete non-regeneration simultanously with constant and maximum response with fidelity of the signal is obtained at the output of the system for a constant input at all frequencies to which the system is tunable and the system is applicable to any desired band of frequencies and to any desired sensitivity or selectivity; this condition being obtained by the combination of the capacitive and inductive impedance elements, both self and mutual, in coordination and operating as a unitary system and by the selection of the magnitudes and values of said impedances and impedance elements, and the electrical relation and circuit position of each impedance to the others, so that when the system is tuned at any frequency to which the system is tunable the sum of all the capacitive reactances, both self and mutual, and the sum of all the inductive reactances, both self and mutual, is substantially zero; to obtain a zero difference of potential in respect to all regenerative currents in any phase across the inter-electrode capacities of the electronic device.

2. A system of amplification of radiant energy comprising in combination an electronic device, the input of which consists of a transformer, a variable capacity, a capacity connected in series between the primary and secondary of the transformer, said capacity being also in series with the variable capacity and said series capacity combination being connected in shunt across the secondary of the transformer; an output circuit comprising in combination a transformer, a capacitive self-impedance connected in series with the plate of the electronic device and the following primary of said transformer, a variable capacity, a capacity connected in series between the primary and secondary of the transformer, the series capacity combination being connected in shunt across the secondary of the transformer, said secondary providing output terminals for the system; the electrical values, both self and mutual, of the aforementioned inductances and capacities constituting the output circuit being of such impedance magnitudes and so related to produce a zero difference of potential in respect to all regenerative currents in any phase between the elements of the electronic device and constituting a system which is non-regenerative; and the plate of the electronic device being connected to a source of direct current through an impedance placed in series between the plate and the source of direct current for the purpose of preventing the flow of alternating current back through the source of direct current supply, but allowing the free flow of the modulated alternating currents from the plate through the primary of the transformer.

3. A system of amplification of radiant energy comprising in combination an electronic device, 5, 6 and 7, the input of which consists of a transformer, 1 and 2, a variable capacity, 3, a capacity, 4, connected in series between the primary and secondary of the transformer, said capacity being also in series with the variable capacity and said series capacity combination, 3 and 4, being connected in shunt across the secondary of the transformer; an output circuit comprising in combination a capacitive self-impedance, 10, connected in series between the plate, 6, of the electronic device and the following primary, 1, a transformer, 1 and 2, a variable capacity, 3, a capacity, 4, connected in series between the primary and secondary of the transformer, the series capacity combination being connected in shunt across the secondary of the transformer, combined with one or more successive stages of amplification, each stage comprising in combination an electronic device whose grid input is connected across the terminals of the secondary, 2, and whose output circuit is comprised of the elements of the output circuit above mentioned; the electrical values, both self and mutual, of the inductances and capacities constituting each output circuit being of such impedance magnitude and so related to produce zero difference of potential in respect to all regenerative currents in any phase between the elements of the electronic device and constituting a system which is non-regenerative; and each plate, 6, of the electronic devices being connected to a source of direct current through an impedance, 9, placed in series between each plate and the source of direct current for the purpose of preventing the flow of alternating current back through the source of direct current supply, but allowing the free flow of the modulated alternating currents from the plates through the primaries of the transformers.

4. A system of amplification of radiant energy comprising in combination a first and a following electronic device, said first electronic device having input means, and an output circuit consisting of a transformer, a variable capacity, a capacity connected in series between the primary and secondary of the transformer, said capacity being also in series with the variable capacity, and both capacities being connected in shunt across the secondary of the transformer, the high potential end of said secondary being connected to the grid of the following electronic device and the low potential end of the secondary being connected to ground or the filament of the following electronic device or some common terminal; and another capacity connected in series between the plate of the first electronic device and the primary, and the electrical values, both self and mutual, of the said inductances and said capacities being relatively such that the system is non-regenerative.

5. A system of amplification of radiant energy comprising in combination an electronic device, having input means, and an output circuit consisting of a transformer, a variable capacity, a capacity connected in series between the primary and secondary of the transformer, said capacity being also in series with the variable capacity, and both capacities being connected in shunt across the secondary of the transformer, and furthermore a capacity connected in series between the plate of the electronic device and the primary, and the electrical values, both self and mutual, of the said inductances and of the said capacities being relatively such that the system is non-regenerative.

6. A system of amplification of radiant energy consisting of elements as set forth in claim 5, the output circuit elements of which provide capacities to form an electrostatic path of energy transfer whose value is definitely variable, and inductances comprising a transformer to form an electromagnetic path whose value is naturally variable with changes of frequency; the electrical relationship of these two paths and their impedance values, associated with the self-impedance values, being such that a maximum transfer of energy is obtained without regeneration or any flow of regenerative currents in any phase at every desired frequency.

7. A system of amplification of radiant energy consisting of elements as set forth in claim 5 wherein the capacity connected between the plate of the electronic device and the primary, as set forth in claim 5, has for one of its purposes, in conjunction with its associated capacities, the prevention of the appearance of direct potential at the primary of the transformer, but permitting the free flow of the modulated alternating currents from the plate through the primary of the transformer and said plate being connected to its source of direct current through a high frequency impedance placed in series between the plate and the source of direct current for the purpose of minimizing the flow of alternating current back through the source of direct current supply, but permitting the flow of direct current from its source to the plate.

8. A system of amplification of radiant energy consisting of elements as set forth in claim 5, combined with one or more additional stages, each stage having a capacity of suitable value connected between the plate of the electronic device and the following primary as set forth in claim 5, and having a suitable source of direct current connected in shunt to a point in the circuit between said plate and the above mentioned capacity, and having a high frequency impedance of suitable value interposed in series in the above mentioned shunt between the source of direct current and the plate, for the purpose of separating the current on the plate into two components, one of which is a modulated alternating component which is allowed to pass freely into the transformer of such stage, but is highly impeded in its flow back through the common source of direct current supply, the other component being a direct current component which is allowed to pass freely from the direct current source to the plate, but is not allowed to appear at the primary of the transformer of such stage.

9. A system of amplification of radiant energy consisting of elements as set forth in claim 5 the output circuit of which comprises an electromagnetic mutual path and an electrostatic mutual path of energy transfer, the impedance values of which are variable automatically by the act of tuning, said values being so related to each other and to the self-impedance values of the system as to produce a zero difference of potential in respect to all regenerative currents in any phase between the grid and plate of the electronic device when the amplifier is tuned to any given frequency.

10. A system of amplification of radiant energy comprising an electronic device, the input of which consists of a transformer, a variable capacity, a capacity connected in series between the primary and secondary of the transformer, said capacity being also in series with the variable capacity, and said series capacity combination being connected in shunt across the secondary of the transformer, and an output circuit consisting of a transformer, a variable capacity, a capacity connected in series between the primary and secondary of said transformer, said capacity being also in series with the variable capacity and both capacities being connected in shunt across the secondary of the transformer and furthermore a capacity connected in series between the plate of the electronic device and the primary, and the impedance values, both self and mutual, of said inductances and capacities being so selected and so related to each other as to simultaneously maintain a condition of complete non-regeneration and a condition of energy transfer maintained constant at its maximum value at every desired frequency.

11. A system of amplification of radiant energy comprising an electronic device the input of which consists of a transformer, a variable capacity, a capacity connected in series between the primary and secondary of the transformer, said capacity being also in series with the variable capacity, and said series capacity combination being connected in shunt across the secondary of the transformer, and an output circuit consisting of a transformer, a variable condenser and a series condenser, said variable and series condensers being connected in series with each other and the two being connected in shunt across the secondary of said transformer and one end of the primary of said transformer being connected into the series connection between the two said condensers, the other end of the primary connected through a condenser to the preceding plate and the impedance values, both self and mutual, of said primary and secondary and of said condensers being selected so as to prevent the production of undesired disturbing oscillations in the circuits associated with the electronic device at all frequencies to which the system is tunable.

12. In a system of amplification of radiant energy comprising an electronic device, the input of which consists of a transformer, a variable capacity, a capacity connected in series between the primary and secondary of the transformer, said capacity being also in series with the variable capacity, and said series capacity combination being connected in shunt across the secondary of the transformer, and an output circuit consisting of a transformer, a variable capacity, a capacity connected in series between the primary and secondary of said transformer, said capacity being also in series with the variable capacity and both capacities being connected in shunt across the secondary of the transformer and furthermore a capacity connected in series between the plate and the following primary, the process of selecting the magnitudes and values of said inductances and capacities, both self and mutual, in combination, and their electrical and circuit relation to each other to maintain the total inductive reactance of the output circuit substantially equal to its total capacitive reactance at all frequencies to which the system is tunable; wherein a zero difference of potential in respect to all regenerative currents in any phase across the interelectrode capacities of the tube or other electronic device is obtained, simultaneously maintaining complete non-regeneration and energy transfer over the entire system constant at its maximum value.

13. In a system of amplification of radiant energy comprising an electronic device, the input of which consists of a transformer, a variable capacity, a capacity connected in series between the primary and secondary of the transformer, said capacity being also in series with the variable capacity, and said series capacity combination being connected in shunt across the secondary of the transformer, and an output circuit consisting of a transformer, a variable capacity, a capacity connected in series between the primary and secondary of said transformer, said capacity being also in series with the variable capacity, and both capacities being connected in shunt across the secondary of the transformer and furthermore a capacity connected in series between the plate and the following primary, said capacities providing electrostatic paths, both self and mutual, and said inductances providing electromagnetic paths, both self and mutual, the process consisting in the selection of the magnitudes and values and the electrical and circuit relation of the said inductances and capacities, both self and mutual, in combination, to obtain an equality between the total capacitive reactance and the total inductance reactance, and in automatically varying the total reactance of the electrostatic elements as the variable capacity is varied to such a degree as to compensate for the natural change in total reactance of the electromagnetic elements arising from change of frequency, to obtain a condition of complete non-regeneration and simultaneously a condition of energy transfer maintained constant at its maximum value for any desired frequency to which the system is tunable.

14. In a system of amplification of radiant energy comprising an electronic device having input means and an output circuit consisting of a transformer, a variable capacity, a capacity connected in series between the primary and secondary of said transformer, said capacity being also in series with the variable capacity, and both capacities being connected in shunt across the secondary of the transformer and furthermore a capacity connected in series between the plate and the following primary, said capacities providing static paths, both self and mutual, and said inductances providing magnetic paths, both self and mutual, the process consisting in the selection of the magnitudes and values and the electrical and circuit relation of the said inductances and capacities, both self and mutual, in combination, to obtain an equality between the total capacitive reactance and the total inductive reactance, and in automatically varying the total reactance of the electrostatic elements as the variable capacity is varied to such a degree as to compensate for the natural change in total reactance of the electromagnetic elements arising from change of frequency, to obtain a condition of complete non-regeneration and simultaneously a condition of energy transfer maintained constant at its maximum value for any desired frequency to which the system is tunable.

15. A system of amplification of radiant energy consisting of elements as set forth in claim 5, combined with one or more additional stages of amplification, the plate of each electronic device being connected to its source of direct current through a high frequency impedance between said plate and said source of direct current for the purpose of presenting a high impedance to the flow of high frequency current through the direct current supply, but readily permitting the flow of direct current from its source to the said plate, each plate being connected to the primary of the following transformer through a capacity as set forth in claim 5, one purpose of which in conjunction with its associated capacities is to prevent the appearance of direct potential in the primary of the transformer, said capacity further being chosen and in such relationship with reference to all the other capacities and inductances, both self and mutual, in the system as set forth in claim 5 as to maintain a substantial equality between the sum of the inductive reactances and the sum of the capacitive reactances at any frequency to which the system is tuned, resulting in a zero difference of potential with respect to all regenerative currents in any phase between grid and plate of the electronic device thereby simultaneously maintaining a condition of optimum and constant energy transfer with no regeneration.

JOSEPH J. DALEY.